(12) United States Patent
Pan et al.

(10) Patent No.: US 12,037,678 B2
(45) Date of Patent: Jul. 16, 2024

(54) MASK

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xiangnan Pan, Beijing (CN); Zhiliang Jiang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 905 days.

(21) Appl. No.: 16/978,078

(22) PCT Filed: Nov. 12, 2019

(86) PCT No.: PCT/CN2019/117522
§ 371 (c)(1),
(2) Date: Sep. 3, 2020

(87) PCT Pub. No.: WO2021/092759
PCT Pub. Date: May 20, 2021

(65) Prior Publication Data
US 2022/0372615 A1 Nov. 24, 2022

(51) Int. Cl.
*C23C 16/04* (2006.01)
*B05C 21/00* (2006.01)
(Continued)

(52) U.S. Cl.
CPC .......... *C23C 16/042* (2013.01); *B05C 21/005* (2013.01); *G03F 7/0015* (2013.01); *H10K 50/84* (2023.02)

(58) Field of Classification Search
None
See application file for complete search history.

(56) References Cited

U.S. PATENT DOCUMENTS 6,791,258 B2 * 9/2004 Haase ..................... H10K 59/35
313/506
8,286,579 B2 * 10/2012 Sung ..................... C23C 14/042
118/301
(Continued)

FOREIGN PATENT DOCUMENTS

CN 202913046 U 5/2013
CN 205420527 U * 8/2016 ........... C23C 14/042
(Continued)

*Primary Examiner* — Jethro M. Pence
(74) *Attorney, Agent, or Firm* — Scully, Scott, Murphy & Presser, P.C.

(57) ABSTRACT

A mask is provided. The mask includes at least one first mask strip. The first mask strip includes a main body and at least one reinforced rib; the main body includes a plate surface defined by a first direction and a second direction, the first direction intersects with the second direction, and the main body extends along the first direction; and the at least one reinforced rib is on the plate surface of the main body and extends along the first direction, and a width of the at least one reinforced rib in the second direction is smaller than a width of the main body in the second direction.

19 Claims, 7 Drawing Sheets

(51) Int. Cl.
*G03F 7/00* (2006.01)
*H10K 50/84* (2023.01)

(56) References Cited

U.S. PATENT DOCUMENTS

| | | | | |
|---|---|---|---|---|
| 8,646,406 B2* | 2/2014 | Ahn | G03F 1/20 | |
| | | | 118/301 | |
| 8,733,277 B2* | 5/2014 | Landgraf | C23C 14/042 | |
| | | | 29/446 | |
| 8,852,346 B2* | 10/2014 | Lee | B05C 21/005 | |
| | | | 156/345.3 | |
| 8,881,676 B2* | 11/2014 | Hong | H10K 71/00 | |
| | | | 118/504 | |
| 9,039,478 B2* | 5/2015 | Kim | G03F 1/22 | |
| | | | 219/136 | |
| 9,045,818 B2 | 6/2015 | Gersdorff | H01L 21/68742 | |
| 9,187,817 B2* | 11/2015 | Kim | C23C 14/042 | |
| 9,192,959 B2* | 11/2015 | Hong | C23F 1/02 | |
| 9,284,638 B2* | 3/2016 | Ko | B05C 21/005 | |
| 9,289,798 B2* | 3/2016 | Park | C23C 14/042 | |
| 9,321,074 B2* | 4/2016 | Ko | C23C 14/042 | |
| 9,327,310 B2* | 5/2016 | Kang | C23C 14/042 | |
| 9,328,407 B2* | 5/2016 | Lee | B05C 21/005 | |
| 9,346,078 B2* | 5/2016 | Oh | B05C 21/005 | |
| 9,372,395 B2* | 6/2016 | Prushinskiy | G03F 1/80 | |
| 9,441,288 B2* | 9/2016 | Sung | C23C 14/042 | |
| 9,530,961 B2* | 12/2016 | Yi | C23C 14/042 | |
| 9,564,590 B2* | 2/2017 | Seo | G03F 1/42 | |
| 9,583,708 B2* | 2/2017 | Ko | C23C 14/042 | |
| 9,657,392 B2* | 5/2017 | Han | C23C 14/042 | |
| 9,673,424 B2* | 6/2017 | Han | C23C 18/31 | |
| 9,695,500 B2* | 7/2017 | Ko | H10K 71/00 | |
| 9,711,724 B2* | 7/2017 | Baek | C23C 14/042 | |
| 9,748,485 B2* | 8/2017 | Lee | H10K 71/166 | |
| 9,780,305 B2* | 10/2017 | Kwen | C23C 16/042 | |
| 9,821,416 B2* | 11/2017 | Kim | B23K 37/0408 | |
| 9,847,485 B2* | 12/2017 | Min | H10K 71/00 | |
| 9,859,495 B2* | 1/2018 | Kang | H10K 71/166 | |
| 9,882,129 B2* | 1/2018 | Jo | C23C 14/042 | |
| 9,931,666 B2* | 4/2018 | Ahn | C23C 14/042 | |
| 9,932,662 B2* | 4/2018 | Lee | C23C 14/042 | |
| 9,953,828 B2* | 4/2018 | Oh | B05C 21/005 | |
| 9,991,477 B2* | 6/2018 | Han | C23C 16/042 | |
| 10,014,471 B2* | 7/2018 | Baek | C23F 1/02 | |
| 10,053,766 B2* | 8/2018 | Kim | C23C 14/042 | |
| 10,083,997 B2* | 9/2018 | Kim | H10K 71/00 | |
| 10,084,133 B2* | 9/2018 | Chen | B05C 21/005 | |
| 10,128,440 B2* | 11/2018 | Lee | H10K 71/00 | |
| 10,141,511 B2* | 11/2018 | Kim | H10K 59/12 | |
| 10,147,880 B2* | 12/2018 | Sung | H10K 50/11 | |
| 10,173,240 B2* | 1/2019 | Mizumura | B05B 12/20 | |
| 10,186,662 B2* | 1/2019 | Kim | H10K 71/166 | |
| 10,196,732 B2* | 2/2019 | Kwon | H10K 99/00 | |
| 10,224,350 B2* | 3/2019 | Kim | H10K 59/12 | |
| 10,283,713 B2* | 5/2019 | Lee | C23C 14/042 | |
| 10,290,807 B2* | 5/2019 | Kim | H10K 71/00 | |
| 10,337,097 B2* | 7/2019 | Ji | C23C 14/042 | |
| 10,344,376 B2* | 7/2019 | Hong | C23C 14/042 | |
| 10,388,873 B2 | 8/2019 | Chang | | |
| 10,396,282 B2* | 8/2019 | Lee | H10K 71/166 | |
| 10,403,860 B2* | 9/2019 | Han | H10K 71/00 | |
| 10,437,144 B2 | 10/2019 | Zhang | | |
| 10,439,170 B2* | 10/2019 | Lin | C23C 14/042 | |
| 10,476,003 B2* | 11/2019 | Kim | H10K 71/164 | |
| 10,533,245 B2* | 1/2020 | Chang | B23K 26/0661 | |
| 10,533,246 B2* | 1/2020 | Mizumura | C25D 3/12 | |
| 10,570,499 B2* | 2/2020 | Lin | H10K 71/164 | |
| 10,625,289 B2* | 4/2020 | Gong | C23C 14/042 | |
| 10,644,240 B2* | 5/2020 | Kim | H10K 71/166 | |
| 10,663,857 B2* | 5/2020 | Lv | C23C 14/12 | |
| 10,679,883 B2* | 6/2020 | Bluck | C23C 16/4585 | |
| 10,737,289 B2* | 8/2020 | Kang | B05D 1/32 | |
| 10,774,415 B2* | 9/2020 | Lin | C23C 14/042 | |
| 10,787,730 B2* | 9/2020 | Lin | C23C 14/042 | |
| 10,818,877 B2* | 10/2020 | Hong | C23C 14/042 | |
| 10,829,847 B2* | 11/2020 | Zhang | B23K 1/0008 | |
| 10,868,268 B2* | 12/2020 | Kim | H10K 50/15 | |
| 10,883,164 B2* | 1/2021 | Kang | C23C 14/042 | |
| 10,897,010 B2* | 1/2021 | Jo | C23C 14/042 | |
| 10,982,314 B2* | 4/2021 | Lin | H10K 71/00 | |
| 11,066,737 B2* | 7/2021 | Li | B05C 21/005 | |
| 11,066,742 B2* | 7/2021 | Yamabuchi | C23C 16/042 | |
| 11,075,340 B2* | 7/2021 | Shin | C23F 4/00 | |
| 11,136,663 B2* | 10/2021 | Kim | C23C 14/042 | |
| 11,136,664 B2* | 10/2021 | Uchida | H10K 71/00 | |
| 11,193,203 B2* | 12/2021 | Shin | C23C 14/042 | |
| 11,203,808 B2* | 12/2021 | Zhu | C23C 14/12 | |
| 11,207,705 B2* | 12/2021 | Gong | B05C 21/005 | |
| 11,217,749 B2* | 1/2022 | Cao | H01J 29/073 | |
| 11,279,999 B2* | 3/2022 | Aoki | C23C 14/24 | |
| 11,313,026 B2* | 4/2022 | Ikenaga | B05C 21/005 | |
| 11,316,111 B2* | 4/2022 | Kim | C23C 14/042 | |
| 11,396,030 B2* | 7/2022 | Lee | B05C 17/06 | |
| 11,414,739 B2* | 8/2022 | Lin | C23C 14/12 | |
| 11,421,314 B2* | 8/2022 | Lee | H10K 71/166 | |
| 11,434,559 B2* | 9/2022 | Aoki | C23C 14/042 | |
| 11,465,163 B2* | 10/2022 | Jo | B05B 12/20 | |
| 11,508,908 B2* | 11/2022 | Kim | H10K 71/00 | |
| 11,542,588 B2* | 1/2023 | Lv | H10K 71/166 | |
| 11,560,615 B2* | 1/2023 | Xu | H10K 71/166 | |
| 11,569,487 B2* | 1/2023 | Hong | C23C 14/541 | |
| 11,608,554 B2* | 3/2023 | Aoki | H10K 71/166 | |
| 11,616,199 B2* | 3/2023 | Kim | H10K 71/00 | |
| | | | 72/19.7 | |
| 11,624,108 B2* | 4/2023 | Moon | H10K 71/00 | |
| | | | 118/721 | |
| 11,668,001 B2* | 6/2023 | Kim | G03F 7/2063 | |
| | | | 118/721 | |
| 11,674,215 B2* | 6/2023 | Kim | G03F 7/2063 | |
| | | | 118/721 | |
| 11,723,256 B2* | 8/2023 | Kang | C23C 14/12 | |
| | | | 438/22 | |
| 11,746,407 B2* | 9/2023 | Sato | C23C 14/24 | |
| 11,751,465 B2* | 9/2023 | Lee | C23C 16/042 | |
| 2010/0055810 A1* | 3/2010 | Sung | H10K 50/11 | |
| | | | 438/22 | |
| 2010/0255191 A1* | 10/2010 | Jung | B05D 1/60 | |
| | | | 427/162 | |
| 2011/0168087 A1* | 7/2011 | Lee | H10K 71/166 | |
| | | | 118/504 | |
| 2012/0329188 A1* | 12/2012 | Sonoda | C23C 14/24 | |
| | | | 118/500 | |
| 2014/0137798 A1* | 5/2014 | Ahn | C23C 16/042 | |
| | | | 118/504 | |
| 2015/0165464 A1* | 6/2015 | Baek | B05C 21/005 | |
| | | | 118/504 | |
| 2016/0005970 A1* | 1/2016 | Kwen | C23C 16/042 | |
| | | | 118/504 | |
| 2016/0079568 A1* | 3/2016 | Han | H10K 71/00 | |
| | | | 438/34 | |
| 2016/0228910 A1* | 8/2016 | Kang | C23C 14/042 | |
| 2016/0322571 A1* | 11/2016 | Lee | H10K 71/00 | |
| 2018/0062079 A1* | 3/2018 | Ko | H10K 71/00 | |
| 2018/0080114 A1* | 3/2018 | Chang | C23C 14/042 | |
| 2018/0337334 A1* | 11/2018 | Kim | B23K 26/402 | |
| 2019/0019994 A1* | 1/2019 | Lin | C23C 14/042 | |
| 2019/0256965 A1* | 8/2019 | Ikenaga | C23C 14/243 | |
| 2019/0352764 A1* | 11/2019 | Nakajima | H10K 71/166 | |
| 2020/0071813 A1* | 3/2020 | Kim | H10K 59/12 | |
| 2020/0190655 A1 | 6/2020 | Zhu et al. | | |
| 2020/0216944 A1* | 7/2020 | Chun | B05B 12/20 | |
| 2020/0232091 A1* | 7/2020 | Ahn | B05C 21/005 | |
| 2021/0054494 A1* | 2/2021 | Ding | C23C 14/042 | |
| 2021/0214837 A1* | 7/2021 | Ikenaga | H05B 33/10 | |
| 2021/0249603 A1* | 8/2021 | Kim | H10K 71/166 | |
| 2021/0364912 A1* | 11/2021 | Sun | G03F 1/64 | |
| 2021/0404079 A1* | 12/2021 | Xiao | H10K 71/00 | |
| 2022/0002858 A1* | 1/2022 | Jiang | B05C 21/005 | |
| 2022/0018011 A1* | 1/2022 | Ko | C23C 14/042 | |
| 2022/0064780 A1* | 3/2022 | Xu | C23C 14/042 | |
| 2022/0102638 A1* | 3/2022 | Jang | H10K 71/00 | |
| 2022/0181595 A1* | 6/2022 | Kim | C23C 14/042 | |
| 2022/0190069 A1* | 6/2022 | Koike | H10K 71/00 | |

(56) References Cited

U.S. PATENT DOCUMENTS

| | | | | |
|---|---|---|---|---|
| 2022/0205077 A1* | 6/2022 | Ikenaga | ............... | C23C 14/243 |
| 2022/0290288 A1* | 9/2022 | Hong | ................ | H10K 71/166 |
| 2022/0316051 A1* | 10/2022 | Yan | .................. | B05C 21/005 |
| 2022/0384769 A1* | 12/2022 | Baek | .................. | H10K 71/00 |
| 2023/0058121 A1* | 2/2023 | Moon | ................. | H10K 71/00 |
| 2023/0085315 A1* | 3/2023 | Bi | ........................ | B23P 15/00 |
| | | | | 118/721 |
| 2023/0167539 A1* | 6/2023 | Aoki | .................. | C23C 14/042 |
| | | | | 118/504 |
| 2023/0193449 A1* | 6/2023 | Kim | ................... | C23C 14/042 |
| | | | | 118/720 |
| 2023/0220535 A1* | 7/2023 | Moon | ................. | C23C 14/042 |
| | | | | 118/721 |
| 2023/0240124 A1* | 7/2023 | Kim | ................... | H10K 71/166 |
| | | | | 118/720 |
| 2023/0272517 A1* | 8/2023 | Anzai | ................. | H05B 33/10 |
| | | | | 118/720 |
| 2023/0295791 A1* | 9/2023 | Deng | .................. | C23C 14/24 |
| | | | | 118/720 |

FOREIGN PATENT DOCUMENTS

| | | | | | |
|---|---|---|---|---|---|
| CN | 205420527 U | | 8/2016 | | |
| CN | 106884140 A | | 6/2017 | | |
| CN | 206692714 U | | 12/2017 | | |
| CN | 108004504 A | * | 5/2018 | ........... | B05C 21/005 |
| CN | 108004504 A | | 5/2018 | | |
| JP | 2009-024195 A | | 2/2009 | | |

\* cited by examiner

MASK

CROSS-REFERENCE TO RELATED APPLICATIONS

This application is a national phase entry of PCT International Application No. PCT/CN2019/117522, filed on Nov. 12, 2019. The disclosure of PCT International Application No. PCT/CN2019/117522 is incorporated by reference herein.

TECHNICAL FIELD

Embodiments of the present disclosure relate to a mask.

BACKGROUND

Organic light-emitting diode (OLED) display devices have advantages such as the thin thickness, light weight, wide viewing angle, active light emission, continuously adjustable light emission color, low cost, fast response speed, low energy consumption, low driving voltage, wide operation temperature range, simple manufacturing process, high luminous efficiency, capacity of flexible display, etc., and have been more and more widely used in display fields such as mobile phones, tablet computers, digital cameras, etc.

In the manufacturing process of the OLED display device, it is usually necessary to encapsulate the display component to prevent the intrusion of moisture, oxygen, or the like. The encapsulation technology of the OLED display device mainly includes cover plate encapsulation and thin film encapsulation, and the thin film encapsulation mainly includes encapsulation using an organic encapsulation layer and/or encapsulation using an inorganic encapsulation layer. In the case where the display component is encapsulated by using the thin film encapsulation technology, the formed organic encapsulation layer and the formed inorganic encapsulation layer are stacked alternately. The organic encapsulation layer is generally formed by using inkjet printing, and the inorganic encapsulation layer is generally formed by using film coating, so that a mask is usually required when forming the inorganic encapsulation layer.

SUMMARY

At least one embodiment of the present disclosure provides a mask, and the mask includes at least one first mask strip; the first mask strip includes a main body and at least one reinforced rib; the main body includes a plate surface defined by a first direction and a second direction, the first direction intersects with the second direction, and the main body extends along the first direction; and the at least one reinforced rib is on the plate surface of the main body and extends along the first direction, and a width of the at least one reinforced rib in the second direction is smaller than a width of the main body in the second direction.

For example, in the mask provided by at least one embodiment of the present disclosure, in the second direction, the at least one reinforced rib is at a middle position of the main body.

For example, in the mask provided by at least one embodiment of the present disclosure, the first direction is perpendicular to the second direction.

For example, in the mask provided by at least one embodiment of the present disclosure, the at least one reinforced rib includes a first reinforced rib and a second reinforced rib, and the first reinforced rib and the second reinforced rib are arranged side by side along the first direction, or the first reinforced rib and the second reinforced rib are arranged side by side along the second direction.

For example, in the mask provided by at least one embodiment of the present disclosure, in a case where the first reinforced rib and the second reinforced rib are arranged side by side along the second direction, the first reinforced rib and the second reinforced rib are symmetrically distributed in the second direction along a center line of the main body perpendicular to the plate surface, and a width of the first reinforced rib in the second direction is identical to a width of the second reinforced rib in the second direction.

For example, in the mask provided by at least one embodiment of the present disclosure, the reinforced rib and the main body are integrally formed.

For example, in the mask provided by at least one embodiment of the present disclosure, a ratio of a thickness of the reinforced rib to a thickness of the main body ranges from $1/4$ to $3/4$.

For example, in the mask provided by at least one embodiment of the present disclosure, a ratio of a width of each of the at least one reinforced rib in the second direction to the width of the main body in the second direction ranges from $1/60$ to $1/30$.

For example, in the mask provided by at least one embodiment of the present disclosure, a cross section of the reinforced rib perpendicular to the first direction is rectangular or trapezoidal.

For example, in the mask provided by at least one embodiment of the present disclosure, a cross section of the main body perpendicular to the first direction is trapezoidal.

For example, in the mask provided by at least one embodiment of the present disclosure, the reinforced rib extends in a zigzag shape along the first direction.

For example, in the mask provided by at least one embodiment of the present disclosure, a material of the first mask strip includes a metal material.

For example, the mask provided by at least one embodiment of the present disclosure further includes a frame, and both ends of the first mask strip are fixed on the frame, respectively.

For example, the mask provided by at least one embodiment of the present disclosure further includes at least one second mask strip, both ends of the second mask strip are fixed on the frame, respectively, and the first mask strip and the second mask strip are arranged in a cross on the frame to form a mask opening of the mask.

For example, in the mask provided by at least one embodiment of the present disclosure, the second mask strip includes an identical structure to the first mask strip.

At least one embodiment of the present disclosure further provides a method for manufacturing a mask. The mask includes at least one first mask strip, and the method includes: providing a substrate, and processing the substrate to form the at least one first mask strip; the first mask strip includes a main body and at least one reinforced rib; the main body includes a plate surface defined by a first direction and a second direction, the first direction intersects with the second direction, and the main body extends along the first direction; and the at least one reinforced rib is on the plate surface of the main body and extends along the first direction, and a width of the at least one reinforced rib in the second direction is smaller than a width of the main body in the second direction.

For example, in the method for manufacturing the mask provided by at least one embodiment of the present disclosure, processing the substrate includes: etching the substrate by using a photolithography process to form the at least one first mask strip.

For example, in the method for manufacturing the mask provided by at least one embodiment of the present disclosure, the etching includes wet etching.

For example, the method for manufacturing the mask provided by at least one embodiment of the present disclosure further includes: providing a frame, and both ends of the first mask strip are fixed on the frame, respectively.

At least one embodiment of the present disclosure further provides a method for depositing a film layer by using the mask according to any one of the embodiments of the present disclosure, and the method includes: depositing the film layer on a panel by using the mask.

For example, in the method for depositing the film layer provided by at least one embodiment of the present disclosure, the panel is an organic light-emitting diode display panel or a quantum dot light-emitting diode display panel.

BRIEF DESCRIPTION OF THE DRAWINGS

In order to clearly illustrate the technical solutions of the embodiments of the present disclosure, the drawings of the embodiments will be briefly described in the following. It is obvious that the described drawings in the following are only related to some embodiments of the present disclosure and thus are not limitative to the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects.

During the process of manufacturing the OLED display device, a mask is generally used to form an inorganic encapsulation layer on the surface of the display panel to prevent, for example, moisture, oxygen, or the like, from adversely affecting the display panel. For example, during the manufacturing process, a plurality of display panels are arranged in an array, and accordingly, a plurality of openings arranged in an array are provided on the mask, each opening area corresponding to the position of each display panel. Therefore, after the mask is aligned with the display panels, an encapsulation material may be deposited in the opening area of the mask by using methods such as chemical vapor deposition, so as to form an encapsulation film layer on the surface of the display panel to achieve the encapsulation of the display panel.

Figure 1A:
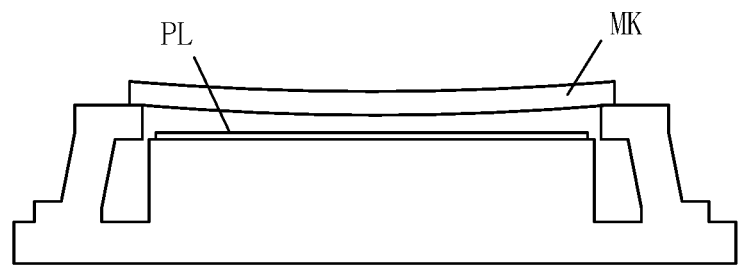
FIG. 1A, FIG. 1B, and FIG. 1C are schematic diagrams of the effect of depositing a film layer on a display panel by using a mask.
Figure 1B:
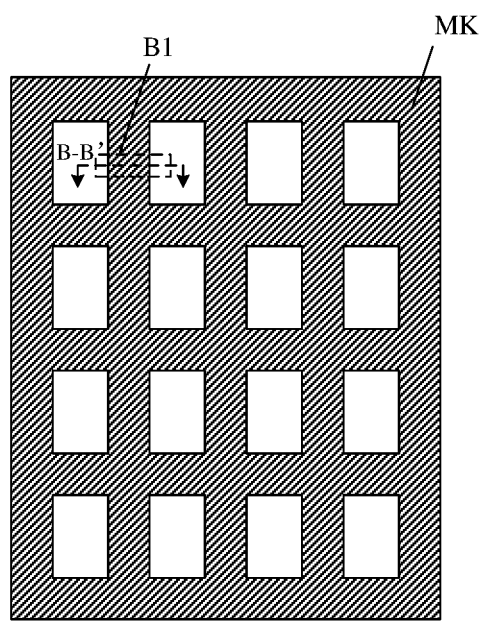

In the actual process, the plurality of openings on the mask usually need to be defined by a plurality of mask strips arranged in a cross. However, because of the own weight of the mask strips, the mask strips tend to sag. For example, two ends of the mask strip are respectively fixed on the frame of the mask, and compared with the portion near the two ends of the mask strip, the middle portion of the mask strip (that is, the portion near the middle area of the mask) is prone to sag due to gravity, thereby causing the middle portion of the mask to sag. Therefore, as illustrated in FIG. 1A and FIG. 1B, after the mask MK is placed on the processing machine and aligned with a plurality of display panels PL arranged in an array, the middle portion of the mask strip of the mask MK may appear obvious sagging. Because the middle portion of the mask strip of the mask sags, the distance between each portion of the mask and the display panel cannot be kept the same, so that an encapsulation layer with a uniform thickness cannot be formed on the surface of the display panel, thereby causing adverse effects on the encapsulation effect of the display panel. As illustrated in FIG. 1B, the mask MK includes a plurality of mask strips in the lateral direction and a plurality of mask strips in the longitudinal direction, and these mask strips cross each other to define the plurality of openings corresponding to the display panels to be manufactured.

Figure 1C:
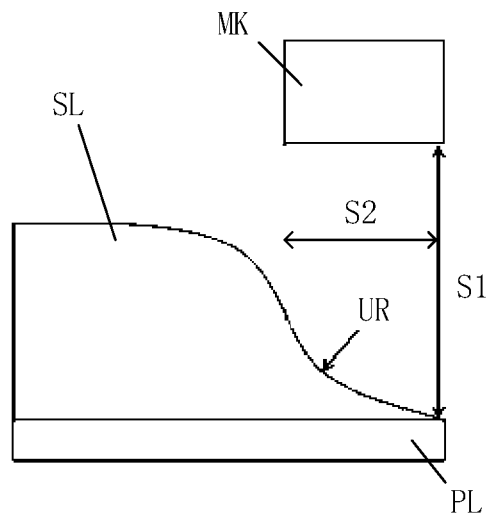

Moreover, as illustrated in FIG. 1A, due to the sagging phenomenon in the middle portion of the mask strip of the mask MK, it is difficult for portions of the mask strip of the mask MK except the middle portion to completely fit the display panel PL, especially there is still a large gap between the edge portion of the mask strip (that is, the end of the mask strip) of the mask MK and the corresponding display panel PL, and therefore, the encapsulation material deposited on the surface of the display panel PL may extend toward the peripheral area of the display panel PL, which leads to the formation of an excessive deposition portion around the periphery of the display panel PL, that is, an under-coating phenomenon occurs. FIG. 1C illustrates a schematic view of the mask MK illustrated in FIG. 1B along the line B-B' at the position B1.

For example, with reference to FIG. 1A, FIG. 1B, and FIG. 1C, taking the end of the mask strip of the mask MK (for example, the position B1 in FIG. 1B) as an example, because the gap S1 between the end of the mask strip of the mask MK and the corresponding display panel PL is large, the extension range S2 of the encapsulation material SL deposited on the surface of the display panel PL towards the peripheral area is large, thereby forming a large area of excessive deposition portion UR, that is, an under-coating phenomenon of a large range occurs.

Therefore, when the display panel is cut to be separated by using, for example, a laser process, especially when the display panel corresponding to the end of the mask strip of the mask is cut, because the area of the excessive deposition area around the display panel is large, the cutting line tends to be located in the excessive deposition area, which leads to cracks at the edge of the encapsulation film layer during cutting. The generated cracks are likely to spread along the encapsulation film layer and thus cause damage to the encapsulation film layer, which leads to the failure of the encapsulation of the display panel and cannot prevent the penetration of moisture, oxygen, etc., thereby causing serious adverse effects on the performance of the display panel, reducing the process yield and the production efficiency of the display panel, and shortening the service life of the display panel.

At least one embodiment of the present disclosure provides a mask, the mask may alleviate the sagging phenomenon of the mask strip due to the own weight by reducing the thickness at the partial area of the mask strip, and further, the mask strip may be made thinner at the partial area as well as has a strong non-deformability through the structural design of the reinforced rib, so that the portions of the mask strip at different positions may be basically maintained on the same horizontal plane, and the sagging phenomenon of the middle portion of the mask may be alleviated. Therefore, when the mask including the mask strip is used to deposit a film layer on a panel, the mask can be better fitted to the panel, so as to reduce the range of the excessive deposition area generated around the panel, and improve the uniformity and consistency of the encapsulation film layer manufactured on the panel, thereby improving the encapsulation effect of the encapsulation film layer formed on the panel and achieving effective encapsulation of the panel.

Hereinafter, some embodiments of the present disclosure are described in detail with reference to the accompany drawings. It should be noted that the same reference numerals in different drawings are used to refer to the same described elements.

At least one embodiment of the present disclosure provides a mask, the mask includes at least one first mask strip, and the first mask strip includes a main body and at least one reinforced rib. The main body includes a plate surface defined by a first direction and a second direction, the first direction intersects with the second direction, and the main body extends along the first direction. The at least one reinforced rib is on the plate surface of the main body and extends along the first direction, and a width of the at least one reinforced rib in the second direction is smaller than a width of the main body in the second direction.

In the mask provided by the embodiments of the present disclosure, by providing the reinforced rib with a width smaller than the width of the main body on the plate surface of the main body of the mask strip, the mask strip may have a strong non-deformability in the case where the own weight of the mask strip is reduced, so that the portions of the mask strip at different positions may be basically maintained on the same horizontal plane, and the sagging phenomenon of the middle portion of the mask may be alleviated.

Therefore, in the case where the mask including the mask strip is used to deposit a film layer on a panel, the mask can be better fitted to the panel, so that the gap between the edge portion of the mask and the corresponding panel is reduced, thereby shortening the path of the deposited film material extending to the periphery of the panel, and reducing the range of the excessive deposition area generated at the periphery of the panel, for example, significantly reducing the range of the excessive deposition area generated at the periphery of the panel corresponding to the end of the mask strip of the mask, so as to avoid cracks occurred on the edge of the encapsulation film layer during cutting, improve the encapsulation effect of the encapsulation film layer, and achieve effective encapsulation of the panel. Therefore, the encapsulation film layer formed on the panel may effectively prevent the intrusion of moisture, oxygen, etc., so that the performance of the panel is improved, thereby prolonging the service life of the panel, and improving the process yield and production efficiency of the panel.

The structure and functions of the mask provided by some embodiments of the present disclosure are specifically described below in connection with different design structures of the mask strip.

Figure 2:
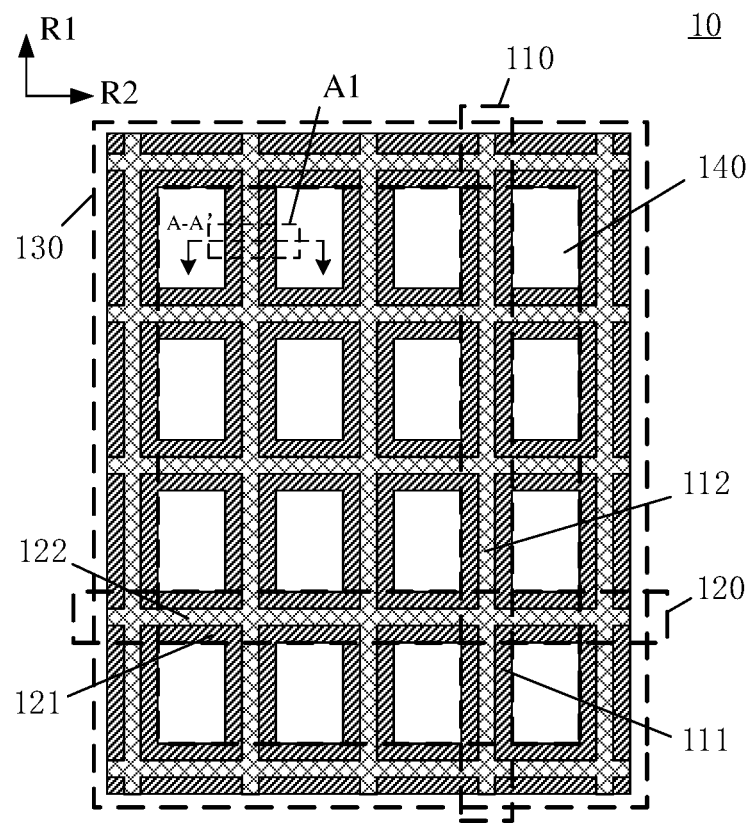
FIG. 2 is a schematic structural diagram of a mask provided by some embodiments of the present disclosure.

FIG. 2 is a schematic structural diagram of a mask provided by some embodiments of the present disclosure. For example, as illustrated in FIG. 2, a mask 10 includes a plurality of first mask strips 110 and a plurality of second mask strips 120, and the plurality of first mask strips 110 and the plurality of second mask strips 120 cross each other to define a plurality of mask openings 140.

For example, the first mask strip 110 includes a main body 111 and a reinforced rib 112. The main body 111 includes a plate surface 1111 (i.e., an upper plate surface and/or a lower plate surface illustrated in FIGS. 3 and 10) defined by a length direction (i.e., a first direction R1) and a width direction (i.e., a second direction R2). The main body 111 extends along the first direction R1 and is in a long strip shape. The reinforced rib 112 is located on the plate surface of the main body 111 and extends along the first direction R1, and a width of the reinforced rib 112 in the second direction R2 is smaller than a width of the main body 111 in the second direction R2. Therefore, by providing the structural design that the width of the reinforced rib 112 is smaller than the width of the main body 111, the total volume of the first mask strip 110 is reduced, thereby reducing the weight of the first mask strip 110. Moreover, through the cooperation of the main body 111 and the reinforced rib 112, the first mask strip 110 may maintain a certain thickness overall to have a strong non-deformability, so that the portions of the first mask strip 110 at different positions may be basically maintained on the same horizontal plane, and the sagging phenomenon of the middle portion of the first mask strip 110 may be alleviated, thereby alleviating the sagging phenomenon of the middle portion of the mask 10.

For example, in some embodiments of the present disclosure illustrated in FIG. 2, the first direction R1 is perpendicular to the second direction R2, that is, the length direction of the main body 111 is perpendicular to the width direction of the main body 111. In some other embodiments of the present disclosure, according to different contour shapes or different requirements of the panel to be encapsulated, the first direction R1 and the second direction R2 may also cross at an angle of, for example, 45°, 60°, or other suitable values, and the embodiments of the present disclosure are not limited thereto.

For example, in some embodiments of the present disclosure illustrated in FIG. 2, the main body 111 extends linearly along the first direction R1, while in some other embodiments of the present disclosure, according to different contour shapes or different requirements of the panel to be encapsulated, the main body 111 may also extend along the first direction R1, for example, in a curved shape or a zigzag shape, as long as the mask 10 includes a suitable mask opening 140 corresponding to the panel, which is not limited in the embodiments of the present disclosure.

For example, a material of the first mask strip 110 includes a metal material, and for example, may include a metal material with high thermal stability and a small coefficient of thermal expansion, such as invar alloy, stainless steel, etc., thereby being beneficial for the first mask strip 110 maintaining a strong non-deformability.

For example, in some other embodiments of the present disclosure, the first mask strip 110 may further be made of other hard materials or other suitable materials, which is not limited in the embodiments of the present disclosure.

Figure 3:
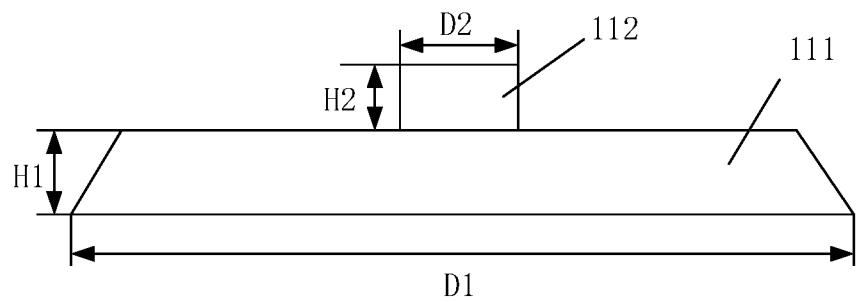
FIG. 3 is a schematic cross-sectional structure diagram of a specific example of a first mask strip illustrated in FIG. 2.

FIG. 3 is a schematic cross-sectional structure diagram of a specific example of a first mask strip illustrated in FIG. 2, that is, the schematic cross-sectional structure diagram of the first mask strip 110 along the line A-A' at the position A1 of the mask 10 illustrated in FIG. 2.

For example, with reference to FIG. 2 and FIG. 3, in the second direction R2, the reinforced rib 112 may be located in the middle of the main body 111, so that the main body 111 and the reinforced rib 112 form a T-shaped structure, thereby allowing the portions of the main body 111 located on both sides of the reinforced rib 112 to be uniformly stressed, and allowing the overall weight of the first mask strip 110 to be reduced while the first mask strip 110 maintains substantially the same bending strength in the first direction R1. Thus, the non-deformability of the first mask strip 110 may be further improved, so that the respective portions of the first mask strip 110 along the first direction R1 may be better maintained on the same horizontal plane, and the sagging phenomenon of the middle portion of the first mask strip 110 may be further alleviated.

For example, in some other embodiments of the present disclosure, according to the requirements of different structural designs of the actual mask 10, for example, according to stress analysis at various positions of the mask 10 based on different design structures, the reinforced rib 112 may also be located at other positions of the main body 111, for example, located at the edge position on the plate surface of the main body 111 to form an L-shaped structure together with the main body 111, which is not limited in the embodiments of the present disclosure.

For example, in some embodiments of the present disclosure, the reinforced rib 112 may be formed integrally with the main body 111. For example, the structure of the first mask strip 110 including the main body 111 and the reinforced rib 112 may be formed by etching the provided material, so that the manufacturing process of the first mask strip 110 is simplified, and the manufacturing cost of the first mask strip 110 is reduced, thereby accordingly simplifying the manufacturing process of the mask 10 and reducing the manufacturing cost of the mask 10.

For example, in the case where the material of the first mask strip 110 is a metal material, the long-strip-shaped material to be processed may be etched by using, for example, a photolithography process, to form the main body 111 and the reinforced rib 112. For example, a strip-shaped substrate to be processed may be provided, and a photoresist is coated on the surface of the strip-shaped substrate and is exposed to form a photoresist retention area and a photoresist removal area. The photoresist retention area corresponds to the reinforced rib 112, and the photoresist removal area corresponds to the remaining portion of the first mask strip 110 except the reinforced rib 112. For example, the developer may be used to clean and remove the photoresist in the exposed photoresist removal area, and then an accurate etching barrier area (i.e., the photoresist retention area) may be formed on the surface of the strip-shaped substrate to be processed. Further, after the area of the surface of the strip-shaped substrate other than the etching barrier area is etched to form the cross-sectional structure illustrated in FIG. 3, the photoresist in the photoresist retention area is exposed and developed to be removed, so as to obtain the first mask strip 110.

For example, in some embodiments of the present disclosure, the main body 111 and the reinforced rib 112 may also be formed by using a deposition process or other suitable processes or methods, which is not limited in the embodiments of the present disclosure.

For example, referring to FIG. 2 and FIG. 3, in some embodiments of the present disclosure, a ratio of the width of the reinforced rib 112 in the second direction R2 to the width of the main body 111 in the second direction R2 may ranges from 1/60 to 1/10, for example, from 1/30 to 1/20.

For example, in the example illustrated in FIG. 3, the width D1 of the main body 111 may be set to 3 mm, that is, the width of the first mask strip 110 is 3 mm, and accordingly, the width D2 of the reinforced rib 112 may be set to 50 μm to 300 μm, for example, 50 μm to 100 μm, which may allow the total volume of the first mask strip 110 to be significantly reduced, thereby reducing the own weight of the first mask strip 110.

For example, in some embodiments of the present disclosure, a ratio of the thickness of the reinforced rib 112 to the thickness of the main body 111 may ranges from 1/4 to 3/4, and further, the thickness of the reinforced rib 112 may be 1/2 of the thickness of the main body 111.

For example, in the example illustrated in FIG. 3, the thickness H2 of the reinforced rib 112 may be 50 μm, the thickness H1 of the main body 111 may be 100 μm, and the total thickness of the first mask strip 110 is 150 μm, so that the first mask strip 110 may maintain a strong non-deformability after the own weight of the first mask strip 110 is reduced, and the respective portions of the first mask strip 110 along the first direction R1 may be substantially maintained on the same horizontal plane.

For example, in the example illustrated in FIG. 3, the cross section of the main body 111 perpendicular to the first direction R1 (i.e., the cross section along the line A-A') is trapezoidal, while in some other examples of the present disclosure, the cross section of the main body 111 perpendicular to the first direction R1 may also be rectangular or in other suitable shapes, which is not limited in the embodiments of the present disclosure.

For example, in the example illustrated in FIG. 3, the cross section of the reinforced rib 112 perpendicular to the first direction R1 (i.e., the cross section along the line A-A') is rectangular, while in some other examples of the present disclosure, the cross section of the reinforced rib 112 perpendicular to the first direction R1 may also be trapezoidal, and for example, the cross section of the reinforced rib 112 perpendicular to the first direction R1 is in the same shape as that of the cross section of the main body 111 perpendicular to the first direction R1. Alternatively, in some other examples of the present disclosure, the cross section of the reinforced rib 112 perpendicular to the first direction R1 may also be triangular or in other suitable shapes, which is not limited in the embodiments of the present disclosure.

For example, in some embodiments of the present disclosure illustrated in FIG. 2, each first mask strip 110 includes a structural design of the main body 111 and the reinforced rib 112, and the structural design of the main body 111 and the reinforced rib 112 in each first mask strip 110 may be the same, for example, may include the cross-sectional structure as illustrated in FIG. 3, so that the respective portions of the mask 10 along the first direction R1 may be substantially maintained on the same horizontal plane, thereby alleviating the sagging phenomenon of the middle portion of the mask 10. In addition, the first mask strips 110 having the same structure may simplify the manufacturing process of the mask 10, reduce the manufacturing cost of the mask 10, and facilitate mass production and application of the mask 10.

In some other embodiments of the present disclosure, according to different actual structural requirements of the mask 10, the design parameters, such as the shape contour, thickness, width, or other design parameters, of the plurality of first mask strips 110 in the mask 10 may also be different from each other, which are not limited in the embodiments of the present disclosure.

For example, in some embodiments of the present disclosure illustrated in FIG. 2, the reinforced rib 112 extends linearly along the first direction R1, while in some other embodiments of the present disclosure, the reinforced rib 112 may also extend in a zigzag shape or a curved shape along the first direction R1. Alternatively, in some other embodiments, the reinforced rib 112 may have a bifurcation (or a branch) extending along the second direction R2 while the reinforced rib 112 extends along the first direction R1, and for example, the planar shape of the reinforced rib 112 may have a shape of "{," which is not limited in the embodiments of the present disclosure.

For example, in some embodiments of the present disclosure illustrated in FIG. 2, the length of the reinforced rib 112 in the first direction R1 is the same as the length of the main body 111 in the first direction R1, while in some other embodiments of the present disclosure, the length of the reinforced rib 112 in the first direction R1 may also be slightly smaller than the length of the main body 111 in the first direction R1, which is not limited in the embodiments of the present disclosure.

For example, as illustrated in FIG. 2, the second mask strip 120 includes the same structure as the first mask strip 110. For example, the second mask strip 120 includes a main body 121 and a reinforced rib 122. The structures and functions of the main body 121 and the reinforced rib 122 may be with reference to the corresponding descriptions of the first mask strip 110, and details are not described herein again.

It should be noted that the second mask strip 120 includes the same structure as the first mask strip 110, which means that the structure of the second mask strip 120 in the length direction may be the same as the structure of the first mask strip 110 in the length direction, and the structure of the second mask strip 120 in the width direction may be the same as the structure of the first mask strip 110 in the width direction, that is, the structure of the second mask strip 120 in the second direction R2 may be the same as the structure of the first mask strip 110 in the first direction R1, and the structure of the second mask strip 120 in the first direction R1 may be the same as the structure of the first mask strip 110 in the second direction R2.

For example, the width of the main body 111 of the first mask strip 110 in the second direction R2 may be the same as or different from the width of the main body 121 of the second mask strip 120 in the first direction R1. Accordingly, the width of the reinforced rib 112 of the first mask strip 110 in the second direction R2 may be the same as or different from the width of the reinforced rib 122 of the second mask strip 120 in the first direction R1, which is not limited in the embodiments of the present disclosure.

For example, as illustrated in FIG. 2, both ends of the first mask strip 110 and both ends of the second mask strip 120 are fixed on a frame 130, respectively. For example, in some embodiments of the present disclosure illustrated in FIG. 2, the first mask strip 110, the second mask strip 120, and the frame 130 are integrally formed, and the frame 130 is provided with the same structure as the first mask strip 110 or the second mask strip 120, so that the total weight of the mask 10 may be further reduced, thereby alleviating the sagging phenomenon of the middle portion of the mask 10.

In addition, because the first mask strip 110, the second mask strip 120, and the frame 130 are integrally formed, there is no need to additionally provide the frame 130 or to connect the first mask strip 110 and the second mask strip 120 with the frame 130 by using, for example, welding or other processes, thereby simplifying the manufacturing process of the mask 10 and reducing the manufacturing cost of the mask 10.

For example, in some other embodiments of the present disclosure, in the case where the first mask strip 110, the second mask strip 120, and the frame 130 are integrally formed, the frame 130 may not be provided with the same structure as the first mask strip 110 or the second mask strip 120, that is, the frame 130 of the mask 10 is not subjected to the structure design including the main body and the reinforced rib. The embodiments of the present disclosure are not limited in this aspect.

For example, the provided substrate may be processed through a mechanical processing process (such as cutting, stamping, etc.) to form the structure including the frame 130, and then the substrate may be etched through, for example, an etching process, to form the structure including the first mask strip 110 and the second mask strip 120. The embodiments of the present disclosure are not limited in this aspect.

For example, in some embodiments of the present disclosure illustrated in FIG. 2, the frame 130 has a rectangular border, while in some other embodiments of the present disclosure, the frame 130 may also have any other suitable shapes, such as a square, a circle, or irregular shapes, which is not limited in the embodiments of the present disclosure.

For example, as illustrated in FIG. 2, the first mask strip 110 extends along the first direction R1, the second mask strip 120 extends along the second direction R2, and the first mask strip 110 and the second mask strip 120 are arranged in a cross to form a mask opening 140. For example, each mask opening 140 corresponds to a panel to be encapsulated. For example, in the case where the panel is a display panel, the mask opening 140 may correspond to the display area of the panel.

For example, in some embodiments of the present disclosure illustrated in FIG. 2, the shape of the mask opening 140 is rectangular, while in some other embodiments of the present disclosure, according to different contour shapes of the panels to be encapsulated, the mask opening 140 may also be designed into other shapes accordingly, for example, regular shapes such as a square, irregular shapes, etc. The embodiments of the present disclosure are not limited in this aspect.

It should be noted that, the specific shape of the mask opening 140 is related to the outline shape of the first mask strip 110 and the outline shape of the second mask strip 120, and therefore, in the case where the edge line of the first mask strip 110 or the edge line of the second mask strip 120 is, for example, a curve or other contours, the shape of the mask opening 140 also changes accordingly. For example, in some embodiments of the present disclosure illustrated in FIG. 2, the edge line of the first mask strip 110 along the first direction R1 and the edge line of the second mask strip 120 along the second direction R2 are both straight lines, while in some other embodiments of the present disclosure, according to different contour shapes or different requirements of the panel to be encapsulated, the edge line of the first mask strip 110 along the first direction R1 and the edge line of the second mask strip 120 along the second direction R2 may also be curves, fold lines, or other suitable contours, as long as the mask 10 includes a suitable mask opening 140 corresponding to the panel, which may not be limited in the embodiments of the present disclosure.

Thus, the first mask strip 110 and the second mask strip 120 cooperate with each other to allow respective portions of the mask 10 along the first direction R1 or along the second direction R2 to be uniformly stressed, so that the respective portions of the mask 10 may be substantially maintained on the same horizontal plane, and the sagging phenomenon of the middle portion of the mask 10 is alleviated. Therefore, in the case where the mask 10 is used to deposit a film layer on a panel, the distance between each portion of the mask 10 and the panel may be substantially kept the same, so that the mask 10 may better fit the panel, thereby improving the uniformity and consistency of the encapsulation film layer prepared on the panel, and improving the encapsulation effect of the panel.

Figure 4A:
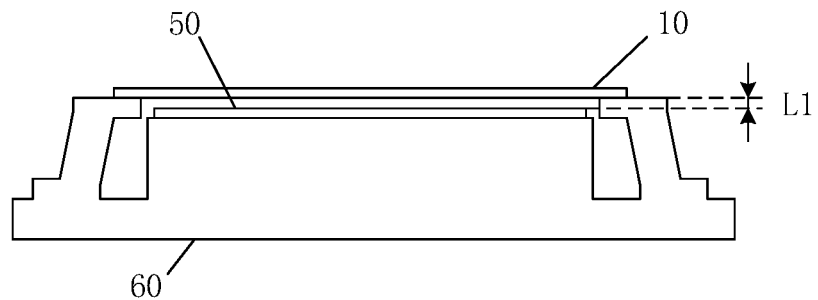
FIG. 4A and FIG. 4B are schematic diagrams of the effect of depositing a film layer on a panel by using the mask illustrated in FIG. 2.

For example, as illustrated in FIG. 4A, in the case where the mask 10 is used to deposit an encapsulation film layer, after the mask 10 is placed on a processing machine 60 and aligned with a plurality of display panels 50 arranged in an array, because the sagging phenomenon of the middle portion of the mask 10 is significantly alleviated, the distances between respective portions of the mask 10 and the panels 50 may be kept substantially the same, that is, the respective portions of the mask 10 may be substantially maintained on the same horizontal plane, so that the mask 10 may better fit the panel 50.

Moreover, because the distances between respective portions of the mask 10 and the panels can be kept substantially the same, the distances between the respective portions of the mask 10 and the panels may be further reduced. For example, as illustrated in FIG. 4A, the distance L1 between the edge portion of the mask 10 (e.g., the end of the mask strip) and the corresponding panel 50 may be significantly reduced, thereby shortening the path of the deposited film material extending to the peripheral area of the panel, and reducing the range of the excessive deposition area generated at the periphery of the panel, for example, significantly reducing the range of the excessive deposition area generated at the periphery of the panel corresponding to the end of the mask strip of the mask. Therefore, when the panel is cut and separated, cracks occurred on the edge of the encapsulation film layer may be avoided, the encapsulation effect of the encapsulation film layer may be improved, and the effective encapsulation of the panel may be achieved, so that the intrusion of moisture, oxygen, etc., can be effectively prevented, and the performance of the panel can be improved, thereby prolonging the service life of the panel, and improving the process yield and production efficiency of the panel.

Figure 4B:
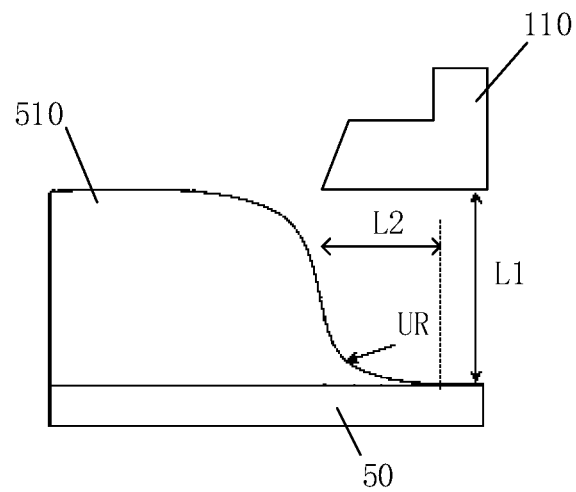

For example, referring to FIG. 4A and FIG. 4B, taking the end of the first mask strip 110 of the mask 10 as an example, because the distances between respective portions of the mask 10 and the panels 50 may be kept substantially the same, the distance L1 between the end of the first mask strip 110 located at the edge position of the mask 10 (for example, the position A1 in FIG. 2) and the corresponding panel 50 may be significantly reduced. When the panel 50 is encapsulated by using the mask 10, the film material is deposited on the surface of the panel 50 by using a method such as chemical vapor deposition to form an encapsulation film layer 510. Because the distance L1 between the end of the first mask strip 110 and the panel 50 is reduced, the path L2 of the film material deposited on the panel 50 extending toward the periphery of the panel 50 is reduced, thereby reducing the range of the excessive deposition area UR generated around the panel 50. In comparison, for the cases illustrated in FIG. 1C and FIG. 4B, in the case where the width of the mask strip is the same, the range of the excessive deposition area UR generated around the periphery of the panel 50 is reduced.

For example, the path L2 of the film layer material extending toward the periphery of the panel 50 may be reduced to 20 μm, thereby avoiding the cutting line from being located in the excessive deposition area UR when the panel 50 is cut, and further avoiding cracks occurring at the edge of the encapsulation film layer 510, so that the encapsulation effect of the encapsulation film layer 510 formed on the panel 50 is improved to achieve effective encapsulation of the panel 50.

For example, the panel 50 may be an organic light-emitting diode display panel, a quantum dot light-emitting diode display panel, or other types of display panels. After the panel 50 is encapsulated, the display component in the panel 50 may be protected from intrusion of moisture, oxygen, or the like, so that the performance of the display component is improved. For example, the panel 50 may also be a panel with other functions or of other types in addition to the display panel, and the embodiments of the present disclosure are not limited in this aspect.

Therefore, by using the mask 10, the encapsulation effect of the encapsulation film layer prepared on the panel can be significantly improved, effective encapsulation of the panel can be achieved, and for example, the penetration of moisture, oxygen, etc. can be effectively prevented, so that the performance of the panel may be improved, the service life of the panel may be prolonged, and further, the process yield and production efficiency of the panel may be improved.

For example, in some embodiments of the present disclosure illustrated in FIG. 2, each first mask strip 110 and each second mask strip 120 include the structure design of the main body and the reinforced rib, respectively, while in some other embodiments of the present disclosure, according to different actual requirements of the mask, only one or part of the plurality of first mask strips and/or one or part of the plurality of second mask strips may include the structure design including the main body and the reinforced rib. For example, only one first mask strip or only one second mask strip located in the middle area of the mask includes the structure design of the main body and the reinforced rib. The embodiments of the present disclosure are not limited in this aspect.

For example, in some embodiments of the present disclosure illustrated in FIG. 2, the mask 10 includes three first mask strips 110 and three second mask strips 120, thereby defining a plurality of mask openings 140 in a 4×4 arrangement. It should be noted that the structure of the mask 10 illustrated in FIG. 2 is only an exemplary description. In some other embodiments of the present disclosure, the mask may also include one, two, four, or more first mask strips, and may also include one, two, four or more second mask strips, so that a plurality of mask openings of different numbers arranged in different ways may be formed. For example, the number of the first mask strips and the number of the second mask strips may be the same or different, which is not limited in the embodiments of the present disclosure.

For example, in some other embodiments of the present disclosure, the frame of the mask may be formed separately from the first mask strip and the second mask strip, and for example, the first mask strip and the second mask strip may be fixed on the frame by means, such as welding, after the first mask strip and the second mask strip are formed. The embodiments of the present disclosure are not limited in this aspect.

Figure 5:
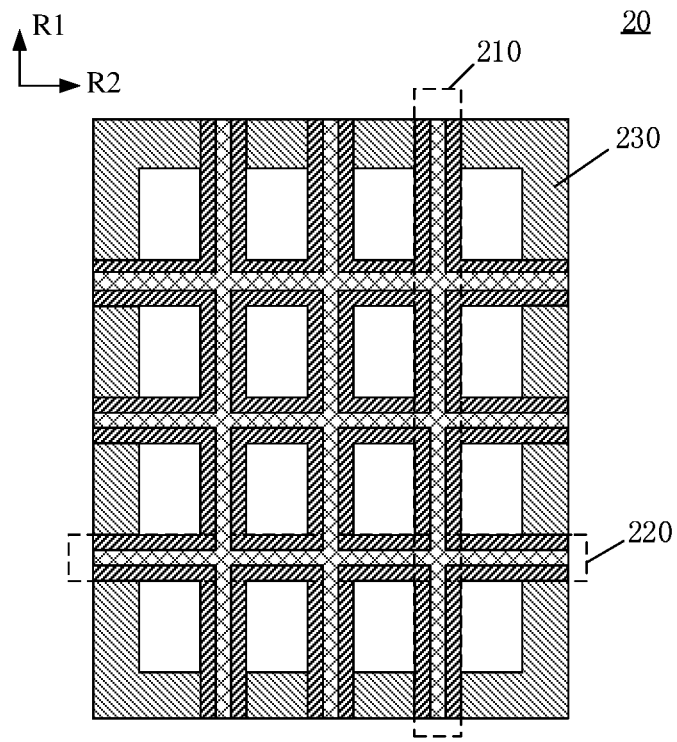
FIG. 5 is a schematic structural diagram of another mask provided by some embodiments of the present disclosure.

FIG. 5 is a schematic structural diagram of another mask provided by some embodiments of the present disclosure. It should be noted that structures of the mask 20 illustrated in FIG. 5 are substantially the same as those of the mask 10 illustrated in FIG. 2 except for the frame 230, and reference may be made to the corresponding descriptions of the mask 10 described above, which is not described herein again.

For example, as illustrated in FIG. 5, the mask 20 includes a plurality of first mask strips 210, a plurality of second mask strips 220, and a frame 230. For example, the frame 230, the first mask strips 210, and the second mask strips 220 are formed separately, that is, the first mask strips 210 and the second mask strips 220 are fixed on the frame 230 after formed.

For example, after the first mask strip 210 and the second mask strip 220 are formed, the first mask strip 210 and the second mask strip 220 may be fixed on the frame 230 of the mask 20 by, for example, welding. For example, the first mask strip 210 and the second mask strip 220 may be directly welded on the surface of the frame 230 of the mask 20, or a plurality of welding grooves may be formed on the frame 230 of the mask 20 to accommodate and fix the first mask strip 210 and the second mask strip 220. For example, the above-mentioned welding grooves may be located at the overlapping positions of the first mask strip 210 and the frame 230 and the overlapping positions of the second mask strip 220 and the frame 230 in FIG. 4. The manner or method of fixing the first mask strip 210 and the second mask strip 220 on the frame 230 is not limited in the embodiments of the present disclosure.

For example, a material of the frame 230 may include a metal material with high thermal stability and small coefficient of thermal expansion, such as invar alloy, stainless steel, or the like. For example, the material of the frame 230 may be the same as the material of the first mask strip 210 and the second mask strip 220, or may be different from the material of the first mask strip 210 and the second mask strip 220, and the embodiments of the present disclosure are not limited in this aspect.

It should be noted that, in some embodiments of the present disclosure illustrated in FIG. 5, the frame 230 does not include the same structure design including the main body and the reinforced rib as the first mask strip 210 or the second mask strip 220, while in some other embodiments of the present disclosure, the frame may also, for example, be etched to form the corresponding structure including the main body and the reinforced rib, so that the frame may cooperate with the first mask strip and the second mask strip to further reduce the weight of the mask, thereby alleviating the sagging phenomenon of the middle portion of the mask.

For example, in some embodiments of the present disclosure illustrated in FIG. 5, the first mask strip 210 and the second mask strip 220 may be integrally formed, and for example, the first mask strip 210 and the second mask strip 220 may be netted, stretched, and tensioned simultaneously, thereby facilitating adjustment of the accuracy of netting and controlling the deformation of netting, so that the first mask strip 210, the second mask strip 220, and the frame 230 form a stable structure after being welded and fixed, which may be beneficial to prolonging the service life of the mask 20.

For example, in some other embodiments of the present disclosure, the first mask strip and the second mask strip may also be formed separately. For example, the first mask strip and the second mask strip may be manufactured separately, and then are fixed such as welded on the frame in an overlapping manner, for example, welded in corresponding welding grooves on the frame.

For example, taking the case where the first mask strip is below the second mask strip as an example, in a direction perpendicular to a main surface of the frame, the depth of the welding groove is substantially equal to or slightly greater than the sum of the thickness of the first mask strip and the thickness of the second mask strip, so that the surface of the second mask strip away from the first mask strip is substantially in the same plane as the main surface of the frame. For example, in the actual manufacturing process, there is a certain accuracy error in the size of the first mask strip, the size of the second mask strip, and the size of the welding groove. In order to ensure that the size of the first mask strip and the size of the second mask strip may be completely accommodated and fixed in the corresponding welding groove, the width of each welding groove may be slightly larger than the width of the corresponding first mask strip or second mask strip, which is not limited in the embodiments of the present disclosure.

It should be noted that more details (such as the shape, size, number, arrangement, etc.) of the first mask strip 210, the second mask strip 220, and the frame 230 may be with reference to the relevant descriptions of the mask 10 in the foregoing embodiments, which are not described herein again.

For example, in some embodiments of the present disclosure, the first mask strip or the second mask strip may include a plurality of reinforced ribs, for example, may include a first reinforced rib and a second reinforced rib. For example, the first reinforced rib and the second reinforced rib may be arranged side by side on the main body of the first mask strip or the second mask strip along the width direction.

Figure 6:
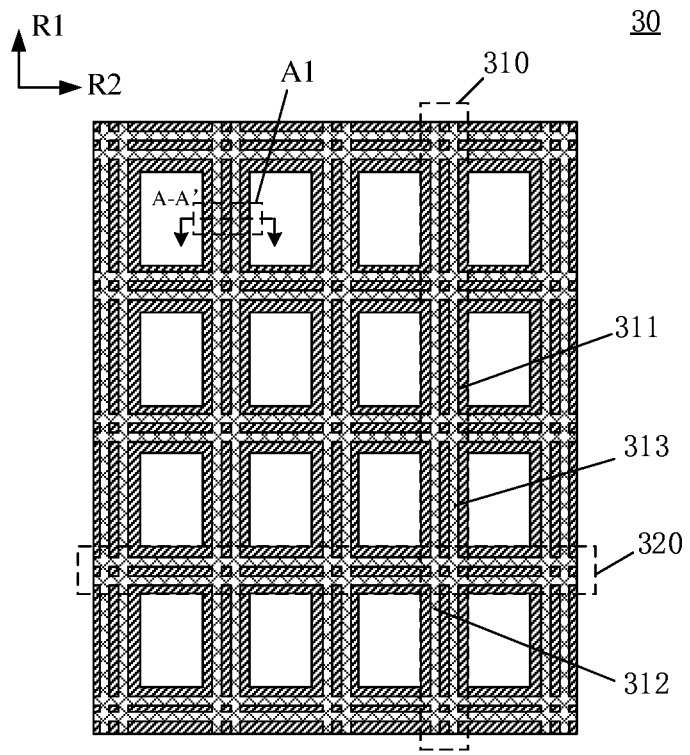
FIG. 6 is a schematic structural diagram of yet another mask provided by some embodiments of the present disclosure.
Figure 7:
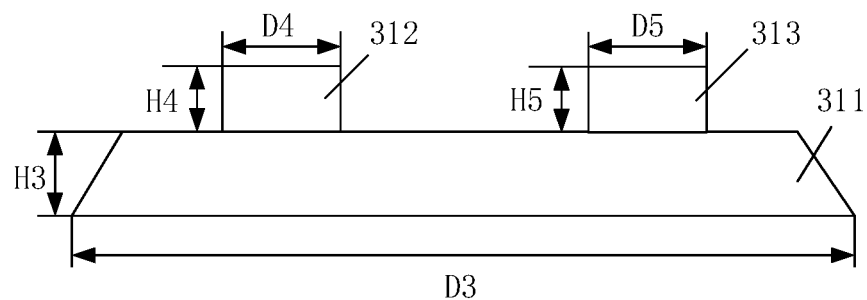
FIG. 7 is a schematic cross-sectional structure diagram of a specific example of a first mask strip illustrated in FIG. 6.

FIG. 6 is a schematic structural diagram of yet another mask provided by some embodiments of the present disclosure. FIG. 7 is a schematic cross-sectional structure diagram of a specific example of a first mask strip illustrated in FIG. 6, that is, the schematic cross-sectional structure diagram of the first mask strip 310 along the line A-A' at the position A1 of the mask 30 illustrated in FIG. 6.

For example, as illustrated in FIG. 6, the mask 30 includes a plurality of first mask strips 310 and a plurality of second mask strips 320.

For example, taking the first mask strip 310 as an example, the first mask strip 310 includes a main body 311, a first reinforced rib 312, and a second reinforced rib 313. The first reinforced rib 312 and the second reinforced rib 313 are arranged side by side along the width direction (i.e., the second direction R2) of the first mask strip 310. Therefore, the design of the first reinforced rib 312 and the second reinforced rib 313 may further improve the non-deformability of the first mask strip 310 in the case where part of the first mask strip 310 is thinned, so that the portions of the first mask strip 310 at different positions may be kept substantially on the same horizontal plane, and the sagging phenomenon of the middle portion of the mask 30 is alleviated.

Figure 10:
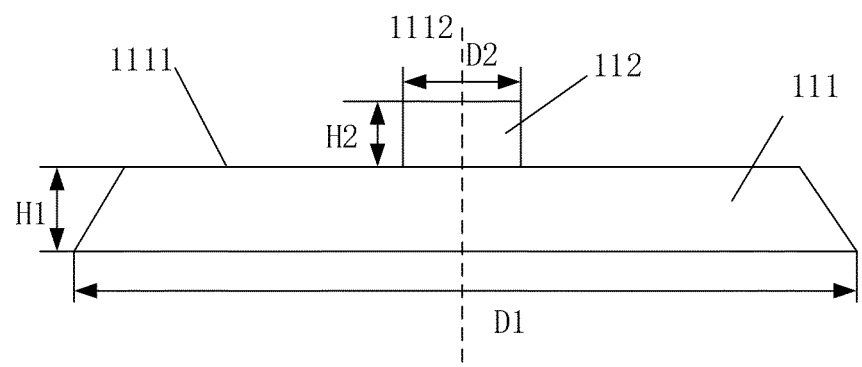
FIG. 10 is a schematic cross-sectional structure diagram of a specific example of a first mask strip illustrated in FIG. 2.

For example, referring to FIG. 6 and FIG. 7, in the second direction R2, the first reinforced rib 312 and the second reinforced rib 313, as a whole, are located in the middle of the main body 311, the first reinforced rib 312 and the second reinforced rib 313 are symmetrically distributed in the second direction R2 along a center line 1112 of the main body 311 perpendicular to the plate surface 1111, as illustrated in FIG. 10 and the width D4 of the first reinforced rib 312 and the width D5 of the second reinforced rib 313 are the same, so that the forces on both sides of the first mask strip 310 in the second direction R2 are uniform and symmetrical.

For example, in the example illustrated in FIG. 6, the width D3 of the main body 311 may be set to 3 mm, that is, the width of the first mask strip 310 is 3 mm, and the width D4 of the first reinforced rib 312 and the width D5 of the second reinforced rib 313 may be set to 50 μm to 100 μm, thereby allowing the total volume of the first mask strip 310 to be significantly reduced and allowing the own weight of the first mask strip 310 to be reduced.

For example, in the example illustrated in FIG. 6, the thickness H4 of the first reinforced rib 312 may be 50 μm, the thickness H5 of the second reinforced rib 313 may be 50 μm, the thickness H3 of the main body 311 may be 100 μm, and the total thickness of the first mask strip 310 is 150 μm, so that the first mask strip 310 may maintain a strong non-deformability while the own weight of the first mask strip 310 is reduced, and the respective portions of the first mask strip 310 along the first direction R1 may be basically maintained on the same horizontal plane.

It should be noted that more details (such as the shape, size, number, arrangement, etc.) of the main body 311, the first reinforced rib 312, and the second reinforced rib 313 may be with reference to the relevant descriptions of the reinforced rib 111 of the mask 10 in the foregoing embodiments, which are not described herein again.

Figure 11:
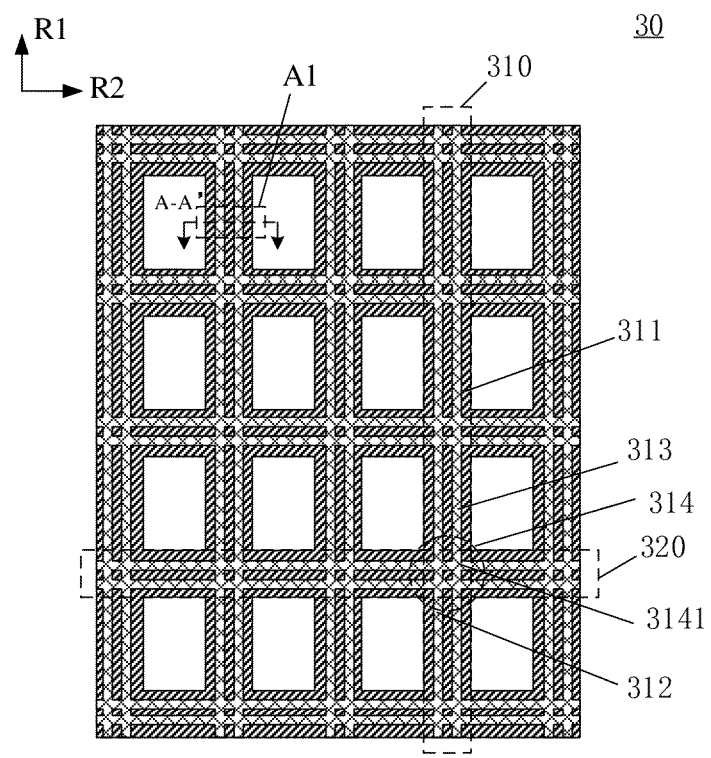
FIG. 11 is a schematic structural diagram of yet another mask provided by some embodiments of the present disclosure.

For example, in some embodiments of the present disclosure illustrated in FIG. 6 and FIG. 7, the first mask strip 310 adopts the structure design including two reinforced ribs (i.e., the first reinforced rib 312 and the second reinforced rib 313), while in some other embodiments of the present disclosure, the first mask strip may further include more reinforced ribs. Alternatively, in some other embodiments of the present disclosure, the first reinforced rib 312 and the second reinforced rib 313 arranged side by side may be connected to each other by a connecting strip at some positions, so that the planar shape of the first mask strip 310 including the first reinforced rib 312 and the second reinforced rib 313 has an "H" shape, which is not limited in the embodiments of the present disclosure. For example, the structures and arrangement of the plurality of reinforced ribs may be with reference to the corresponding descriptions of the first reinforced rib 312 and the second reinforced rib 313, and details are not described herein again. As illustrated in FIG. 11, the second mask strip 320 comprises a third reinforced rib and a fourth reinforced rib, the first mask strip 310 and the second mask strip 320 are arranged in a cross 314 on the frame 130 to form a mask opening of the mask, and in a position of the cross 314 of the first mask strip 310 and the second mask trip 320, the first reinforced rib 312 and the second reinforce rib 313 cross the third reinforced rib and the fourth reinforced rib respectively to form four reinforced rib cross points 3141.

For example, in some embodiments of the present disclosure illustrated in FIG. 6 and FIG. 7, the second mask strip 320 includes the same structure as the first mask strip 310. For example, the structure and functions of the second mask strip 320 may be with reference to the corresponding description of the first mask strip 310, and details are not described herein again.

It should be noted that, in some other embodiments of the present disclosure, the structure of the second mask strip may also be different from the structure of the first mask strip. For example, the second mask strip may include only one main body and one reinforced rib, that is, include the structure similar to the second mask strip 120 illustrated in FIG. 2, or the second mask strip may also adopt other structure designs, which is not limited in the embodiments of the present disclosure.

For example, in some embodiments of the present disclosure illustrated in FIG. 6 and FIG. 7, the frame of the mask 30 may adopt the same or similar structure as the frame 130 in the mask 10 illustrated in FIG. 2. The structure and functions of the frame of the mask 30 may be with reference to the corresponding descriptions of the frame 130 described above, and details are not described herein again.

It should be noted that more details (such as the shape, size, number, arrangement, etc.) and effects of the first mask strip 310, the second mask strip 320, and the frame in the mask 30 may be with reference to the relevant descriptions of the mask 10 in the aforementioned embodiments, and details are not described herein again.

For example, in some embodiments of the present disclosure, in the case where the first mask strip or the second mask strip includes a plurality of reinforced ribs, for example, includes the first reinforced rib and the second reinforced rib, the first reinforced rib and the second reinforced rib may also be arranged side by side along the length direction of the first mask strip or the second mask strip.

Figure 8:
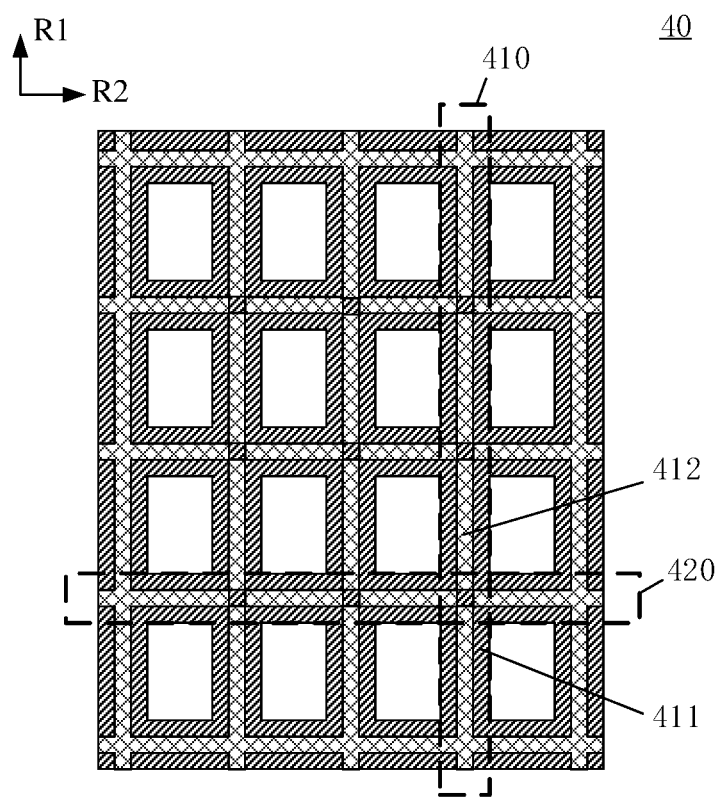
FIG. 8 is a schematic structural diagram of yet another mask provided by some embodiments of the present disclosure.

FIG. 8 is a schematic structural diagram of yet another mask provided by some embodiments of the present disclosure.

For example, as illustrated in FIG. 8, a first mask strip 410 and a second mask strip 420 of a mask 40 may include a main body and a plurality of reinforced ribs, respectively. For example, taking the first mask strip 410 as an example, a plurality of reinforced ribs 412 may be arranged side by side on a main body 411 along a length direction (i.e., the first direction R1) of the first mask strip 410.

For example, in some other embodiments of the present disclosure, the first mask strip may further include 2, 3, 5, or more reinforced ribs arranged side by side along the first direction R1, and the embodiments of the present disclosure are not limited in this aspect.

For example, more details (such as the shape, size, number, arrangement, etc.) and effects of the first mask strip 410 and the second mask strip 420 may be with reference to the relevant descriptions of the mask 10 in the foregoing embodiments, which are not described herein again.

At least one embodiment of the present disclosure further provides a method for manufacturing a mask. The mask includes at least one first mask strip. The method includes: providing a substrate, and processing the substrate to form the at least one first mask strip. The first mask strip includes a main body and at least one reinforced rib; the main body includes a plate surface defined by a first direction and a second direction, the first direction intersects with the second direction, and the main body extends along the first direction; and the at least one reinforced rib is on the plate surface of the main body and extends along the first direction, and a width of the at least one reinforced rib in the second direction is smaller than a width of the main body in the second direction.

Figure 9:
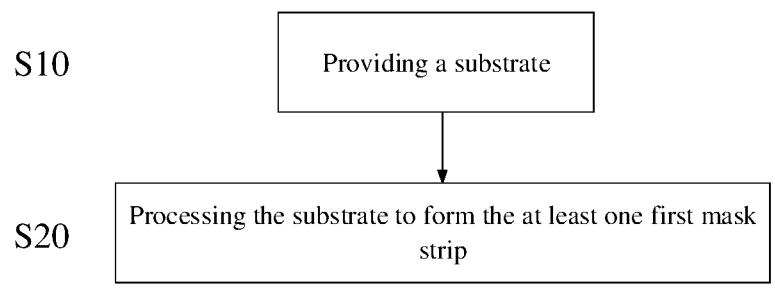
FIG. 9 is a flowchart of a method for manufacturing a mask provided by some embodiments of the present disclosure.

FIG. 9 is a flowchart of a method for manufacturing a mask provided by some embodiments of the present disclosure. For example, the method for manufacturing the mask includes the following steps.

Step S10: providing a substrate.

Step S20: processing the substrate to form the at least one first mask strip.

For example, taking the mask 10 illustrated in FIG. 2 as an example, the method for manufacturing the mask 10 may include the following steps.

Step S110: providing a substrate.

Step S120: processing the substrate to form the at least one first mask strip 110.

For example, in some embodiments of the present disclosure, the substrate may be etched by using a photolithography process to form the first mask strip 110, for example, to form a structure including the main body 111 and the reinforced rib 112.

For example, the etching may be wet etching.

For example, in the case of manufacturing the mask 20 illustrated in FIG. 5, the method for manufacturing the mask provided by some embodiments of the present disclosure may further include: providing the frame 230. For example, both ends of the first mask strip 210 may be fixed on the frame 230 by welding or other methods, respectively.

For example, the mask manufactured by using the manufacturing method provided by any one of the embodiments of the present disclosure may alleviate the sagging phenomenon of the mask strip due to the own weight by thinning the partial portion of the mask strip, and through the structure design of the reinforced rib, the mask strip may be thinned in partial areas while the mask strip has strong non-deformability, so that the portions of the mask strip at different positions may be basically maintained on the same horizontal plane, thereby alleviating the sagging phenomenon of the middle portion of the mask.

At least one embodiment of the present disclosure further provides a method for depositing a film layer by using the mask according to any one of the embodiments of the present disclosure, and the method includes: depositing the film layer on a panel by using the mask.

For example, in some embodiments of the present disclosure, the panel may be an organic light-emitting diode display panel.

For example, in some other embodiments of the present disclosure, the panel may also be a panel having a display function, such as an electronic paper display panel, or other types of panels, and the embodiments of the present disclosure are not limited in this aspect.

For example, the panel encapsulated by using the mask may be any product or component having a display function, such as a display substrate, a display panel, an electronic paper, a mobile phone, a tablet computer, a television, a display, a notebook computer, a digital photo frame, a navigator, etc., which is not limited in the embodiments of the present disclosure.

For example, in the case of using the mask described in any one of the embodiments of the present disclosure to deposit the film layer on the panel, the mask can better fit the panel, thereby reducing the range of the excessive deposition area generated around the panel and improving the uniformity and consistency of the encapsulation film layer manufactured on the panel, so as to improve the encapsulation effect of the encapsulation film layer formed on the panel and achieve effective encapsulation of the panel.

The following statements should be noted.

(1) The accompanying drawings involve only the structure(s) in connection with the embodiment(s) of the present disclosure, and other structure(s) can be referred to common design(s).

(2) For the purpose of clarity, in accompanying drawings for illustrating the embodiment(s) of the present disclosure, the thickness of a layer or a region may be enlarged or narrowed, that is, these drawings are not drawn to actual scale. It should be understood that, in the case where an element such as a layer, a film, a region, a substrate, or the like is referred to as being "on" or "under" another element, the element may be "directly" "on" or "under" the another element, or there may be intermediate elements.

(3) In case of no conflict, features in one embodiment or in different embodiments can be combined to obtain new embodiments.

What have been described above are only specific implementations of the present disclosure, and the protection scope of the present disclosure is not limited thereto. Any modifications or substitutions easily occur to those skilled in the art within the technical scope of the present disclosure should be within the protection scope of the present disclosure. Therefore, the protection scope of the present disclosure should be based on the protection scope of the claims.

What is claimed is:

1. A mask, comprising at least one first mask strip,
wherein the first mask strip comprises a main body and at least one reinforced rib;
the main body comprises a plate surface defined by a first direction and a second direction, the first direction intersects with the second direction, and the main body extends along the first direction; and
the at least one reinforced rib is on the plate surface of the main body and extends along the first direction, and a width of the at least one reinforced rib in the second direction is smaller than a width of the main body in the second direction,
wherein the at least one reinforced rib comprises a first reinforced rib and a second reinforced rib, the first reinforced rib and the second reinforced rib are arranged side by side along the second direction, the first reinforced rib and the second reinforced rib are symmetrically distributed in the second direction along a center line of the main body perpendicular to the plate surface,
the mask further comprises at least one second mask strip and a frame, the at least one second mask strip comprises a third reinforced rib and a fourth reinforced rib, the third reinforced rib and the fourth reinforced rib are arranged side by side along the first direction, the third reinforced rib and the fourth reinforced rib are symmetrically distributed in the first direction along a center line of a main body of the second mask strip perpendicular to a plate surface of the second mask strip, the first mask strip and the second mask strip are arranged in a cross on the frame to form a mask opening of the mask, wherein in a position of the cross of the first mask strip and the second mask strip, the first reinforced rib and the second reinforce rib cross the third reinforced rib and the fourth reinforced rib respectively to form four reinforced rib cross points.

2. The mask according to claim 1, wherein in the second direction, the at least one reinforced rib is at a middle position of the main body.

3. The mask according to claim 1, wherein the first direction is perpendicular to the second direction.

4. The mask according to claim 1, wherein
a width of the first reinforced rib in the second direction is identical to a width of the second reinforced rib in the second direction.

5. The mask according to claim 1, wherein the reinforced rib and the main body are integrally formed.

6. The mask according to claim 1, wherein a ratio of a thickness of the reinforced rib to a thickness of the main body ranges from 1/4 to 3/4.

7. The mask according to claim 1, wherein a ratio of a width of each of the at least one reinforced rib in the second direction to the width of the main body in the second direction ranges from 1/60 to 1/30.

8. The mask according to claim 1, wherein a cross section of the at least one reinforced rib perpendicular to the first direction is rectangular or trapezoidal.

9. The mask according to claim 1, wherein a cross section of the main body perpendicular to the first direction is trapezoidal.

10. The mask according to claim 1, wherein the reinforced rib extends in a zigzag shape along the first direction.

11. The mask according to claim 1, wherein a material of the first mask strip comprises a metal material.

12. The mask according to claim 1,
wherein both ends of the first mask strip are fixed on the frame, respectively.

13. The mask according to claim 12, further comprising at least one second mask strip,
wherein both ends of the second mask strip are fixed on the frame, respectively.

14. The mask according to claim 13, wherein the second mask strip comprises an identical structure to the first mask strip.

15. A method for depositing a film layer by using a mask, wherein the mask comprises at least one first mask strip, the first mask strip comprises a main body and at least one reinforced rib, the main body comprises a plate surface defined by a first direction and a second direction, the first direction intersects with the second direction, the main body extends along the first direction, the at least one reinforced rib is on the plate surface of the main body and extends along the first direction, and a width of the at least one reinforced rib in the second direction is smaller than a width of the main body in the second direction; and the method comprises:
depositing the film layer on a panel by using the mask,
wherein the at least one reinforced rib comprises a first reinforced rib and a second reinforced rib, the first reinforced rib and the second reinforced rib are arranged side by side along the second direction, the first reinforced rib and the second reinforced rib are symmetrically distributed in the second direction along a center line of the main body perpendicular to the plate surface, the mask further comprises at least one second mask strip and a frame, the at least one second mask strip comprises a third reinforced rib and a fourth reinforced rib, the third reinforced rib and the fourth reinforced rib are arranged side by side along the first direction, the third reinforced rib and the fourth reinforced rib are symmetrically distributed in the first direction along a center line of a main body of the second mask strip perpendicular to a plate surface of the second mask strip, the first mask strip and the second mask strip are arranged in a cross on the frame to form a mask opening of the mask, wherein in a position of the cross of the first mask strip and the second mask strip, the first reinforced rib and the second reinforce rib cross the third reinforced rib and the fourth reinforced rib respectively to form four reinforced rib cross points.

16. The method for depositing the film layer by using the mask according to claim 15, wherein the panel is an organic light-emitting diode display panel or a quantum dot light-emitting diode display panel.

17. A method for manufacturing a mask, wherein the mask comprises at least one first mask strip, and the method comprises:
providing a substrate, and
processing the substrate to form the at least one first mask strip,
wherein the first mask strip comprises a main body and at least one reinforced rib;
the main body comprises a plate surface defined by a first direction and a second direction, the first direction intersects with the second direction, and the main body extends along the first direction; and
the at least one reinforced rib is on the plate surface of the main body and extends along the first direction, and a width of the at least one reinforced rib in the second direction is smaller than a width of the main body in the second direction,
wherein the at least one reinforced rib comprises a first reinforced rib and a second reinforced rib, the first reinforced rib and the second reinforced rib are arranged side by side along the second direction, the first reinforced rib and the second reinforced rib are symmetrically distributed in the second direction along a center line of the main body perpendicular to the plate surface,
the mask further comprises at least one second mask strip and a frame, the at least one second mask strip comprises a third reinforced rib and a fourth reinforced rib, the third reinforced rib and the fourth reinforced rib are arranged side by side along the first direction, the third reinforced rib and the fourth reinforced rib are symmetrically distributed in the first direction along a center line of a main body of the second mask strip perpendicular to a plate surface of the second mask strip, the first mask strip and the second mask strip are arranged in a cross on the frame to form a mask opening of the mask,
wherein in a position of the cross of the first mask strip and the second mask strip, the first reinforced rib and the second reinforce rib cross the third reinforced rib and the fourth reinforced rib respectively to form four reinforced rib cross points.

18. The method for manufacturing the mask according to claim 17, wherein processing the substrate comprises: etching the substrate by using a photolithography process to form the at least one first mask strip.

19. The method for manufacturing the mask according to claim 17, further comprising:
provide the frame, wherein both ends of the first mask strip are fixed on the frame, respectively.

\* \* \* \* \*